United States Patent [19]

Mohri et al.

[11] 3,739,650

[45] June 19, 1973

[54] UHF TUNER

[75] Inventors: Etsuzo Mohri, Osaka; Hiroshi Saito, Hirakata; Toshio Hayakawa, Kodoma; Shigeru Ochiai, Neyagawa, all of Japan

[73] Assignee: Matsushita Electric Industrial Co., Ltd., Osaka, Japan

[22] Filed: Mar. 15, 1971

[21] Appl. No.: 124,353

[30] Foreign Application Priority Data

| | | |
|---|---|---|
| Apr. 16, 1970 | Japan | 45/32788 |
| Apr. 16, 1970 | Japan | 45/32789 |
| Apr. 16, 1970 | Japan | 45/32790 |
| Apr. 16, 1970 | Japan | 45/37125 |
| Apr. 16, 1970 | Japan | 45/37126 |
| Apr. 16, 1970 | Japan | 45/37127 |

[52] U.S. Cl. .................... 74/10.6, 74/10.45, 74/10.8

[58] Field of Search ............. 267/155; F16h/35/18; 74/10.6, 10.8, 10.45, 10.5; 267/155

[56] References Cited

UNITED STATES PATENTS

| | | | |
|---|---|---|---|
| 3,415,127 | 12/1968 | Miner et al. | 74/10.6 |
| 3,459,055 | 8/1969 | Sperber | 74/10.6 |

*Primary Examiner*—Milton Kaufman

*Attorney*—Stevens, Davis, Miller & Mosher

[57] ABSTRACT

A presettable type UHF tuner to tune in UHF television channels. It comprises a channel switch-over shaft mounted in a tuner chassis, a rotary drum assembly rotatably disposed within the tuner chassis and rotatable with the channel switch-over shaft, a plurality of fine tuning screws carried by the rotary drum assembly and displacable in the direction parallel to the axis of the rotary drum assembly, a slide member slidably mounted in the tuner casing and slidable in the direction of displacement of the fine tuning screws, said slide member being provided with an integral engagement piece adapted to be successively engaged by the fine tuning screws as the rotary drum assembly rotates, and a tuner rotor shaft coupled to the slide member. By turning the channel switch-over shaft the rotation of the rotary drum assembly with the channel switch-over shaft cause the successive switching of the plurality of fine tuning screws into engagement with the engagement piece on the slide member, thereby achieveing the sliding movement of the slide member to rotate the tuner rotor shaft for the switching-over of the UHF channels.

4 Claims, 6 Drawing Figures

PATENTED JUN 19 1973

3,739,650

SHEET 1 OF 5

E. MOHRI,
H. SAITO
T. HAYAKAWA
AND
S. OCHIAI
INVENTORS

BY Stevens, Davis, Miller & Mosher
ATTORNEYS

UHF TUNER

This invention relates to UHF tuners for television receivers. UHF tuners for television receivers are usually of a continuous tuning type similar to the tuning system adapted for radio sets. Therefore, the tuning in UHF channels has been extremely difficult as compared to the tuning in VHF channels. Such continuous tuning systems for the UHF tuners has heretofore been sufficient, since only two or three UHF channels have been authorized in one locality. However, where more UHF channels, namely seven or eight channels, are available for reception, a non-continuous type UHF tuner, which enables simpler tuning operation, is desired.

More desirably, the fine tuning control is presettable, so that the desired channel may be readily selected by merely turning the main channel switch-over shaft.

Accordingly, it is an object of the invention to provide a UHF tuner, which comprises a channel switch-over shaft mounted in a tuner casing, a rotary drum assembly rotatably disposed within a tuner casing and rotatable with the channel switch-over shaft, a plurality of fine tuning screws carried by the rotary drum assembly and displacable in the direction parallel to the axis of the rotary drum assembly, a slide member slidably mounted in the tuner casing and slidable in the direction of displacement of the fine tuning screws, said slide member being provided with an engagement piece adapted to be successively engaged by the fine tuning screws as the rotary drum assembly rotates, and a tuner rotor shaft coupled to the slide member, and in which by turning the channel switch-over shaft the rotation of the rotary drum assembly with the channel switch-over shaft causes the successive switching of the plurality of fine tuning screws into engagement with the engagement piece of the slide member, thereby achieving the sliding movement of the slide member to rotate the tuner rotor shaft coupled thereto for the switching-over for the UHF channels.

According to one feature of the invention, once the channels tuned in are memorized by the respective fine tuning screws as they are displaced to the corresponding positions, a desired channel may be selected by merely turning the channel switch-over shaft without requiring any subsequent operation for the fine tuning adjustment.

According to another feature of the invention, the fine tuning screws for engagement with the engagement piece of the slide member to move the slide member are provided with respective integral cams, which are adapted to be first brought into engagement with a conical surface of a cam roller and guided by the cam roller as they successively roll on the conical surface prior to being brought into engagement with the engagement piece. With this arrangement, the successive engagement and disengagement of the fine tuning screws with and off the engagement piece of the slide member may be effected very smoothly, so that the switching of channels may be made by lightly turning the channel switch-over shaft.

According to a further feature of the invention, as the fine tuning screws and the slide member are adapted to be moved in the direction parallel to the axis of the rotary drum, a UHF tuner small in size and reliable in operation may be obtained.

According to a still further feature of the invention, the force urging the tuner rotor shaft may be varied by merely rotating the rotor shaft. This arrangement eliminates the manual operation of removing and re-fitting the spring urging the rotor shaft, which would otherwise be necessary to adjust the urging force on the rotor shaft. Besides, as the spring urging the rotor shaft is disposed co-axially with the rotor shaft, the force tending to tilt the rotor shaft may be greatly reduced. Further, this arrangement itself requires reduced space.

The above and other objects, features and advantages of the invention will become more apparent from the following description with reference to the accompanying drawing, which illustrates a preferred embodiment of the UHF tuner according to the invention, and in which.

Figures 4, 5:
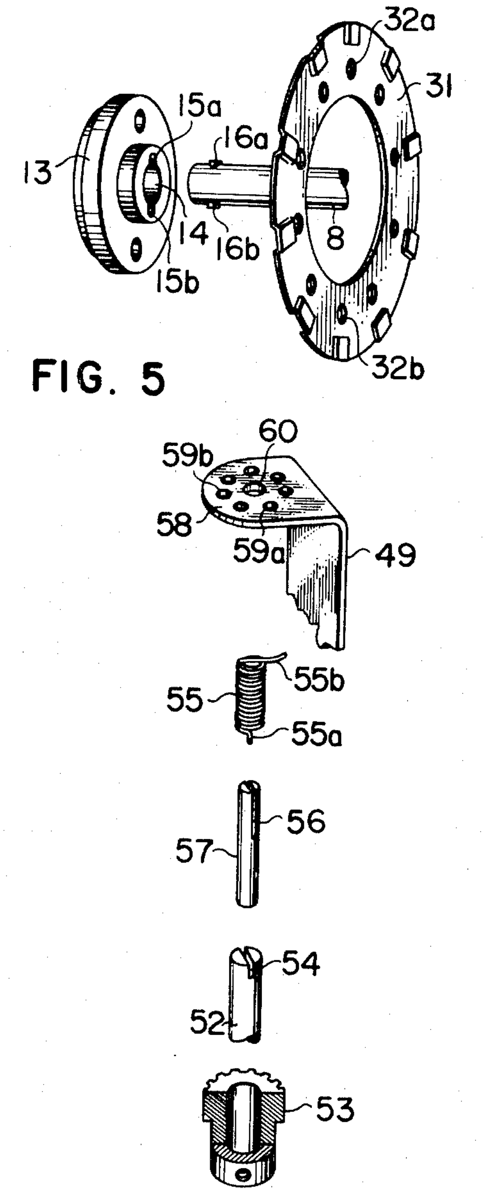
FIG. 4 depicts an exploded, partly fragmentary perspective view showing the rotary drum assembly and channel switch-over shaft.
FIG. 5 depicts an exploded, partly fragmentary perspective view showing the tuner rotor shaft torque transmission section.

Referring now to the drawings, reference numeral 1 designates a tuner chassis having a top wall 2, a front wall 4 secured by screws 3 to the front end bracket of the top wall 2, and a rear wall 6 secured by screws 5 to the rear end bracket of the top wall 2. To the front wall 4 is secured a bearing 7, in which a channel switch-over shaft 8 is rotatably mounted. As clearly shown in FIG. 2, the tuner chassis 1 accommodates a rotary drum assembly consisting of a drum member 11, which has a rear central shaft extension 9 rotatably mounted in a bearing opening 10 formed in the rear wall 6. To the drum member 11 is secured by bolts **12*a* and 12*b* a front drum member holder 13. As is clearly shown in FIG. 4, the drum member holder 13 has a front boss formed with a cylindrical front recess 14, in which is received the rear end of the channel switch-over shaft 8. Projections 16*a* and 16*b* formed on the channel switch-voer shaft 8 are received in respective spline grooves 15*a* and 15*b* formed along the recess 14, so that the rotary drum assembly can rotate with the channel switch-over shaft 8**.

Beam rods **17*a* and 17*b* connect the front and rear walls 4 and 6 of tuner chassis 1 to prevent the vibration of the front and rear plates 4 and 6**.

The drum member 11 is stepped mid-way between its ends as indicated at 18 to form a large diameter front portion 19 and a small diameter rear portion 21. The large diameter front portion 19 is formed with an annular recess 20 adjacent to its periphery and open to the front. The small diameter rear portion 21 has its rear end formed with a gear 22, which may constitute a drive of an external indicator or a remote control drive. The bottom of the annular recess 20, which is defined by the stepped shoulder 18 of the drum member 11, is formed with a plurality of radially spaced guide openings, for instance ten openings **23*a*, 23*b*, –, to guide respective cylindrical members 25***a*, 25*b*, –. The cylindrical members 25*a*, 25*b*, – are integral with the rear portion of respective threaded members 24*a*, 24*b*, – constituting the fine tuning screws as indicated at 26*a*, 26*b*, –, are slidable along the respective guide openings in the direction parallel to the axis of the rotary drum assembly They are provided at their rear end with respective integral conical cams 27*a*, 27*b*, – and at their front end within the annular recess 20 with respective stops 28*a*, 28*b*, –. The range or coverage of the axial displacement of the fine tuning screws 26*a*, 26*b*, – is determined as the cams 27*a*, 27*b*, – strike the shoulder 18 and as the stops 28*a*, 28*b*, – strike the bottom surface of the annular recess 20. The rotation of the fine tuning screws 26*a*, 26*b*, – is prevented as axial ridges 29*a*, 29*b*, – formed on the respective cylindrical members 25*a*, 25*b*, – are received in respective spline grooves (not shown) respectively formed along the guide openings 23*a*, 23*b*, –.

The drum member 11 is made integral with a front annular disc member 31 (FIG. 4), which is formed with circumferentially spaced openings 32*a*, 32*b*, –, through which in turn extend the corresponding threaded portions 24*a*, 24*b*, – of the fine tuning screws 26*a*, 26*b*, –. Actually, the threaded portions 24*a*, 24*b*, – of the fine tuning screws 26*a*, 26*b*, – mesh with associated nuts 34*a*, 34*b*, –, which are disposed within the annular recess 20 and fitted in the respective openings 32*a*, 32*b*, – in the annular disc member 31. The nuts 34*a*, 34*b*, – have respective peripheral pinion gears 33*a*, 33*b*, –. They are urged against the annular disc member 31 by spring members 36*a*, 36*b*, – interposed between the associated one of them on one hand and shoulders 35*a* and 35*b* of the annular recess 20 on the other hand.

It will be seen that the rotation of the nuts 34*a*, 34*b*, – causes an axial displacement of the corresponding fine tuning screws 26*a*, 26*b*, with respect to the rotary drum assembly.

A fine tuning sleeve 37 is telescoped on the channel switch-over shaft 8. It is provided at its rear end with an integral gear 38, which is forwardly urged against a front bracket member 42 secured by bolts 41*a* and 41b to the front plate 4 by the spring force of a compression spring 40 mounted on the channel switch-over shaft 8 and in contact at one end to a washer 39 in contact with the bearing 7 and at the other end to the rear end of the fine tuning sleeve 37.

Secured to the front bracket member 42 is a flanged pin 43 carrying a sleeve member 44 rotatably and telescopically mounted thereon. The sleeve member 44 is formed adjacent at its front end with a first pinion gear 45 always meshing with the gear 38 of the fine tuning sleeve 37 and adjacent its rear end with a second pinion gear 46 capable of meshing with the gears 33*a*, 33*b*, – of the nuts 34*a*, 34*b*, – meshing with the associated fine tuning screws 26*a*, 26*b*, –.

The sleeve member 44 is forwardly urged by a compression spring 47 interposed between the front plate 4 and its geared flange 45, with the front end of the first pinion gear 45 held in forcible contact with a flange 48 formed on the fine tuning sleeve 37 on the front end of the gear 38.

With the advancement of the fine tuning sleeve 37 against the spring force of the spring 40, the sleeve member 44 is advanced by the flange 48 against the spring force of the spring 47 to bring the pinion gear 46 into mesh with one of the gears 33*a*, 33*b*, – of the respective nuts 34*a*, 34*b*, –. By turning the fine tuning sleeve 37 while holding it in its advanced position, the torque exerted to it is transmitted through its gear 38, the pinion gears 45 and 46 of the sleeve member 44 and one of the gears 33*a*, 33*b*, – of the nuts 34*a*, 34*b*, to the corresponding nut to rotate the same, thus causing an axial displacement of the corresponding one of the fine tuning screws 26*a*, 26*b*, –.

Secured to the rear plate 6 of the tuner chassis 1 is an auxiliary plate 49, to which is secured by bolts 51a tuner proper 50 having a rotor shaft 52 provided with a rotor shaft gear 53 secured thereto. As is clearly shown in FIG. 5, the rotor shaft 52 is formed at its upper end within the rotor shaft gear 53 with a notch or groove 54. A torsion spring 55 mounted on a torsion spring shaft 57 has its one end received in the notch 54 formed in the rotor shaft 52 and its other end portion passed through an elongate axial notch 56 formed in the upper portion of the torsion spring shaft 57. The end of the torsion spring 55 remote from the rotor shaft 52 is received in one of a plurality of openings 59*a*, 59*b*, – formed in an upper perpendicular projection 58 of the auxiliary plate 49 along a circle concentric with the torsion spring shaft 57, which rotatably extends through an opening 60 also formed in the aforesaid projection of the auxiliary plate 49 at the center of the aforesaid concentric circle.

Figure 3:
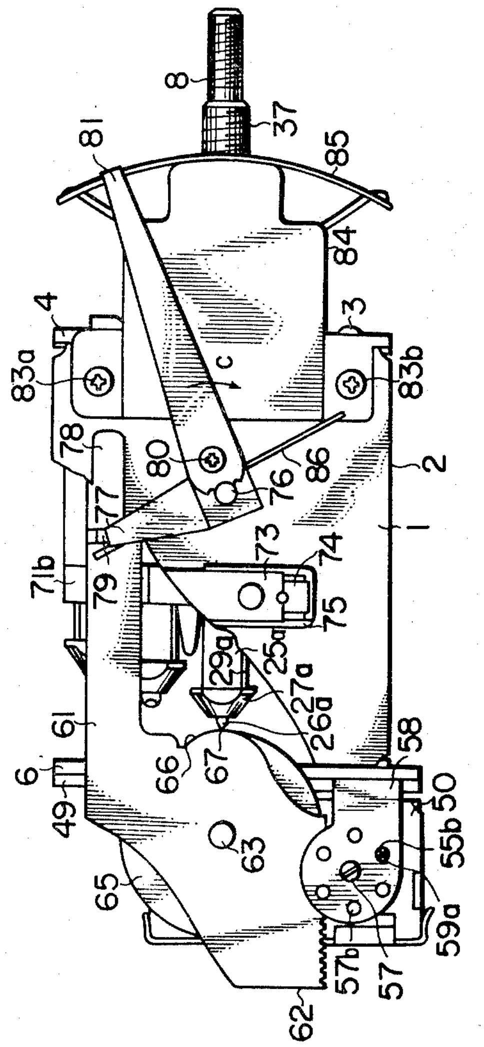
FIG. 3 depicts a top view, partly broken away, showing the UHF tuner of FIG. 1.

As is most clearly shown in FIG. 3, a slide member 61 slidably penetrates through the front and rear plates 4 and 6 of the tuner chassis 1 and the auxiliary plate 49. It has a rack 62 formed along its rear portion and meshing with the afore-said pinion gear 53 secured to the tuner rotor shaft 52. The torsion spring 55, which is coupled between the upper projection 58 of the auxiliary plate 49 and the rotor shaft 52, always urges the rotor shaft 52 in the direction of arrow *a* in FIG. 1 to forwardly urge the slide member 61, thus preventing the backlash between the rack 62 of the slide member 61 and the pinion 53 secured to the rotor shaft 52.

The slide member 61 is provided with a downwardly extending roller pin 63 secured thereto and rotatably carrying a conical cam roller 65 having an inverted or downwardly tapering conical surface 64. It is also provided with a downwardly extending arcuate engagement piece 66 secured thereto, which is adapted to be brought into engagement with the rear end of the fine tuning screws 26*a*, 26*b*, – as these screws revolve with the drum member 11 to the highest position. The arcuate face 67 of the arcuate engagement piece 66 substantially coincides with the extension of the peripheral surface of the top portion, i.e., the largest diameter portion, of the cam roller 65.

With the rotation of the rotary drum assembly in unison with the channel switch-over shaft 8, the fine tuning screws 26*a*, 26*b*, – revolving with the drum assembly are successively brought into engagement with the engagement piece 66. At this time, the cams 27*a*, 27*b*, – provided to the respective cylindrical member 25*a*, 25*b*, – integral with the respective fine tuning screws 26*a*, 26*b*, successively engage and roll on the conical surface 64 of the cam roller 65 to be guided thereby before the rear end of the fine tuning screws 26*a*, 26*b*, engages with the mid-part of the arcuate face 67 the engagement piece 66 due to the spring force of the torsion spring 55. If the rear end of the fine tuning screw to engage with the engagement piece 66 is positioned rearwardly with respect to the mid-part of the arcuate face 67 of the engagement piece 66, the cam roller 65 and the engagement piece 66 are pushed rearwardly or in the direction of arrow *b* in FIG. 1 in unison with the slide member 61 as the associated cam provided to the cylindrical member integral with the fine tuning screw engages and rolls on the cam roller 65 and the rear end of the fine tuning screw goes from the cam roller 65 over to the engagement piece 66. The slide member 61 is moved to a most rearward position when the rear end of the fine tuning screw reaches the mid-part, or most forward part, of the arcuate face 67 of the engagement piece 66. On the other hand, if the rear end of a fine tuning screw to engage with the engagement piece 66 is positioned forwardly with respect to the end of the preceding fine tuning screw, the slide member 61 is moved forwardly or oppositely in the direction of arrow *b* by the restoring force of the torsion spring 55 as the engagement piece 66 detached off a fine tuning screw is brought into engagement with the next fine tuning screw.

When each fine tuning screw 26*a*, 26*b*, – is in engagement with the engagement piece 66, it is forwardly urged due to the spring force of the torsion spring 55. Accordingly, the highest part of the annular disc member 31 at the front of the rotary drum assembly corresponding to the fine tuning screw in engagement with the engagement piece 66 is urged against a stop 69 secured by a bolt 68 to the underside of the top plate 2 of the tuner chassis 1, so that the tilting of the rotary drum assembly may be prevented.

Also, to the end of smoothly bringing the fine tuning screws 26*a*, 26*b*, – into engagement with the engagement piece 66, the rear end of the fine tuning screws 26*a*, 26*b*, – is made arcuate as indicated at 70*a*, 70*b*, –.

The drum member 11 of the rotary drum assembly is formed with a continuous peripheral wavy portion adjacent the end of the large diameter portion 19. The wavy portion defines alternate hills 71a and valleys 71b, against which are urged a roller 74 extending in an opening 75 formed in the top plate 2 of the tuner chassis 1 and rotatably mounted on the free end of a plate spring 73 secured at the other end by a bolt 72 to the top plate 2. The valleys 71*b* of the wavy portion correspond to the respective fine tuning screws 26*a*, 26*b*, –, and provide a nodal character to the rotation of the rotary drum assembly, and hence the channel switch-over shaft 8. As the roller 74 engages in one of the valleys 71b, the corresponding fine tuning screw is held in position, in which it engages with the mid-part of the arcuate face 67 of the engagement piece 66. The nodal character, which is imparted to the rotation of the drum assembly by the forced engagement between the roller 74 and the wavy portion 71*a* and 71*b*, can thus simplify the tuning operation.

As shown in FIG. 3, a rotary arm 77 is rotatably mounted on a support pin 76 secured to the top plate of the tuner chassis 1. The rotary arm 77 has its free end folded, which extends through a longitudinal slot formed in the top plate 2 and received in an opening 79 formed in the slide member 61. To a part of the rotary arm 77 is secured by a bolt 80 a pointer 81 having a folded free end 82 extending in the proximity of the front face of a channel channel indicator 85 attached to a support plate 84 secured by bolts 83*a* and 83*b* to the overside of the top plate 2. The pointer 81 is urged in the direction of arrow *c* by a tension spring 86 stretched between the rotary arm 77 and the support plate 84. The rotation of rotary arm 77 due to the spring force of the spring 86 is restricted as the free end of the rotary arm 77 is engaging with the forward edge of the opening 79 the slide member 61.

With the axial displacement of the slide member 61, the pointer 81 is rotated with the rotary arm 77, so that the free end of the pointer 81 sweeping the channel indicator 85 comes to a position corresponding to the channel tuned in.

With the UHF tuner according to the invention, the UHF band from channel 13 to channel 62 inclusive (in Japan) is covered by the rotation of the rotor shaft 52 of the tuner proper 50 through an angle of about 170°. This angle of rotation of the rotor shaft 52 corresponds to the displacement of the slide member 61 between a position, in which the mid-part of the arcuate face 67 of the engagement piece 66 is in engagement with a fine tuning screw in the most rearward position with the stop of the associated cylindrical member engaging with the bottom wall of the annular recess 20, and a position, in which the mid-part of the arcuate face 67 is in engagement with a fine tuning screw in the most forward position with the associated cam engaging with the shoulder 18 of the drum member 11.

Actually, channel 13 and channel 62 in the UHF band are not concurrently available for reception in the same locality. Also, the channels that are apart in frequency from each other by more than one-half the entire band ranging between the lowest frequency UHF channel and the highest frequency UHF channel are not concurrently assigned in one area. In this respect, in accordance with the invention the bandwidth coverage is set to be one-half the entire frequency band ranging between the lowest frequency and highest frequency UHF channels. By so doing, the fine tuning screws 26*a*, 26*b*, – may be spaced less apart to enable reducing the diameter of the drum member 11 and hence the size of the tuner itself as well as promoting smooth switching operation.

Figure 6:
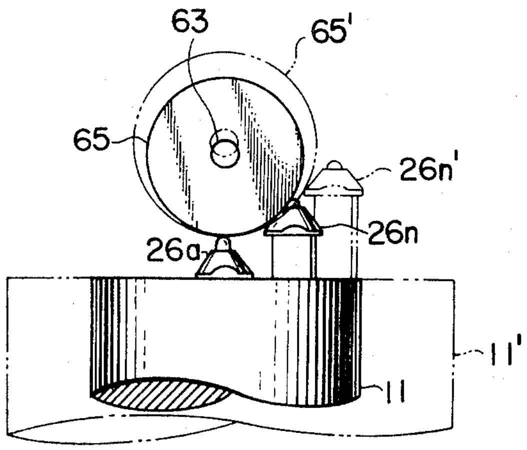
FIG. 6 illustrates the dimensional relation of the cam roller to the range of displacement of the fine tuning screws.

Referring now to FIG. 6, if the lowest frequency UHF channel (channel 13) and the highest frequency UHF channel (channel 62) were to be memorized respectively by the fine tuning screws 26*a* and 26*n* it would be necessary to have an axial distance between points corresponding to the rear ends of the fine tuning screws 26a and 26n of, for instance, 1.5 cm, a diameter of the drum member 11′ of about 8 mm, a distance between the fine tuning screws 26*a*, and 26*n* of about 2 cm and a diameter of the cam roller 65′ of about 3.3 cm, as indicated by the broken lines. On the other hand, with the preset bandwidth coverage as described above it is possible to reduce the axial distance between points corresponding to the rear ends of the fine tuning screws 26*a* and 26*n* to about 0.75 cm, the diameter of the drum member 11 to about 6 cm, the distance between the fine tuning screws 26*a* and 26 *n* to about 1.2 cm and the diameter of the cam roller 65 to about 2.7 cm as indicated by solid lines. Thus, the size of the tuning mechanism of the UHF tuner may be reduced without substantially degradating its function.

Figure 1:
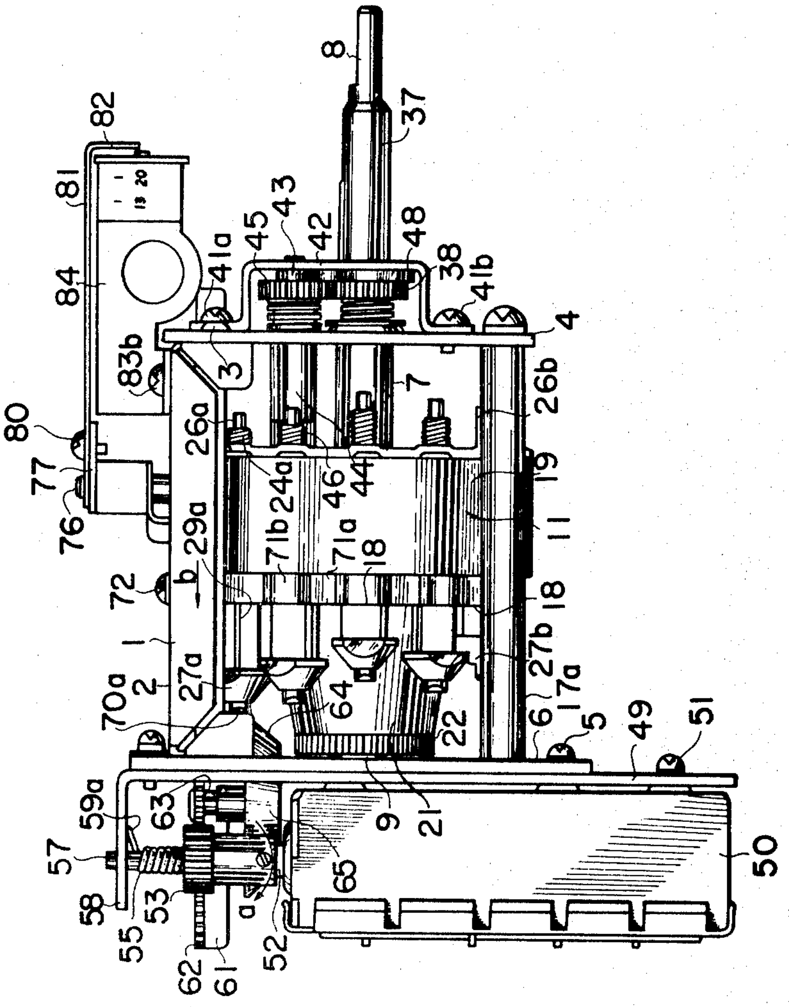
FIG. 1 depicts a side view of the UHF tuner according to the invention.
Figure 2:
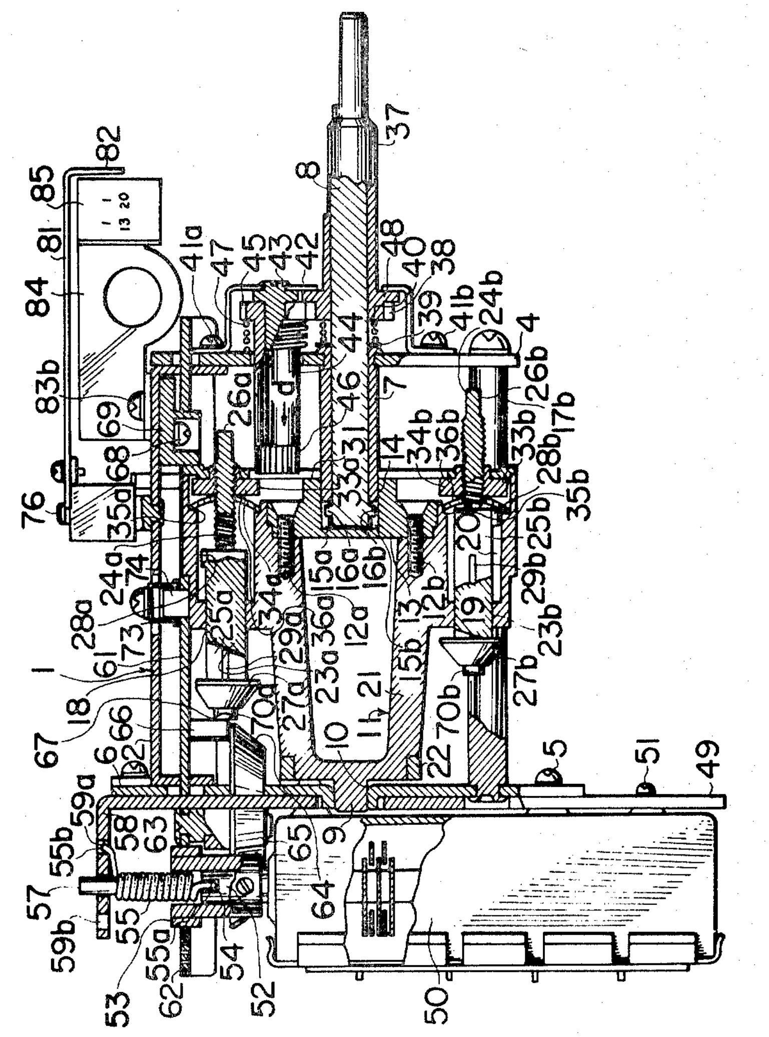
FIG. 2 shows, mostly in axial elevational section, the UHF tuner of FIG. 1.

With the construction of the UHF tuner described above according to the invention, the fine tuning screws 26*a*, 26*b*, – may be preset to memorize a plurality of UHF channels. A fine tuning screw in engagement with the engagement piece 66 of the slide member 61 such as the fine tuning screw 26*a* in FIGS. 1 and 2 is ready for pre-adjustment to memorize any desired UHF channel. For the pre-adjustment, the fine tuning sleeve 37 is advanced against the spring force of the spring 40 and is then rotated while maintaining its advanced axial position. As it is advanced against the spring force of the spring 40, its flange 48 pushes the sleeve member 44 with the pinion gears 45 and 46 in the direction of arrow *d* in FIG. 2, bringing the second pinion gear 46 into mesh with the gear 33*a* of the nut 34*a* meshing with the fine tuning screw 26*a* now in engagement with the engagement piece 66. By subsequently turning the fine tuning sleeve 37 while holding it in this advanced axial position, the sleeve member 44 is rotated through the gears 38 and 45 to rotate the nut 34*a* through the gears 46 and 33*a*, causing the axial movement of the fine tuning screw 26*a* in unison with the slide member 61, which is urged by the torsion spring 55. With the linear movement of the slide member 61, the rotor shaft 52 is rotated through the rack 62 and pinion 53. In this manner the fine tuning screw 26*a* may be pre-adjusted to tune in the desired channel to be memorized by it. When the desired channel is tuned in, the fine tuning sleeve 27 may be released, whereupon the sleeve 37 and the sleeve member 44 are retracted to their initial positions by the respective springs 40 and 47.

Even after the fine tuning sleeve 37 has retreated, the channel thus tuned in is maintained by the fine tuning screw 26*a* unless it is switched over. As the channel thus tuned in is memorized by the fine tuning screw 26*a*, it will be re-tuned in when the fine tuning screw 26*a* brought into re-engagement with the engagement piece 66 after one revolution caused by turning the channel switch-over shaft 8. At this time, the rotor shaft 52 assumes the same angular position as previously brought to in pre-adjusting the fine tuning screw 26*a*.

The same procedure applies to the pre-adjustment of the remaining fine tuning screws 26*b* to 26*n* to make them memorize respective channels. The number of channels that can be memorized corresponds to the number of the fine tuning screws.

It is to be emphasized that for the engagement of the successive fine tuning screws 26*a*, 26*b*, – with the engagement piece 66 in course of the rotation of the rotary drum assembly in unison with the channel switch-over shaft 8, the conical surface of each cam 27*a*, 27*b*, – provided to each cylindrical member 25*a*, 25*b*, – integral with each fine tuning screw 26*a*, 26*b*, – is guided over the conical surface 64 of the cam roller 65 as the rear end of each fine tuning screw 26*a*, 26*b*, – approaches the engagement piece 66. As the end of each fine tuning screw 26*a*, 26*b*, – is arcuate, it can be smoothly transferred from the cam roller 65 to the engagement piece 66. Further, as the forced engagement between the wavy portion 71*a* and 71*b* of the drum member 11 and the urging roller 74 provides a stop, the channels may be switched very easily. Furthermore, as the stop 69 engages the annular disc member 31 of the rotary drum assembly at a part thereof in the vicinity of the fine tuning screw, whose cam is struck by the engagement piece 66 due to the spring force of the torsion spring 55, the force exerted to the rotary drum assembly is substantially taken up by the stop 69, so that the tilting or vibration of the rotary drum assembly is prevented.

In addition, the indication of the channel tuned in is effected as the rotation of the channel switch-over shaft 8 causes the rotation of the rotary arm 77 coupled to the slide member 61 to vary the position of the pointer relative to the channel indicator board 85.

Also, the spring force of the torsion spring 55 urging the slide member 61 to provide for the forced contact between the engagement piece 66 and each fine tuning screw 26*a*, 26*b*, – may be readily adjusted by rotating the torsion spring shaft 57. With the rotation of the shaft 57 the tip of the end portion of the torsion spring 55, which extends through the elongate axial notch 56 of the shaft 57, is successively shifted into engagement in the openings 59*a*, 59*b*, – formed in the upper projection 58 of the auxiliary plate 49 to vary the force urging the rotor shaft 52, thus varying the force urging the slide plate 61.

As has been described in the foregoing, according to the invention it is possible to have the fine tuning screws 26*a*, 26*b*, – to memorize respective UHF channels, so that a desired channel may be readily tuned in by merely turning the channel switch-over shaft 8 without requiring any subsequent fine tuning control operation, and the channel tuned in may be indicated by means of the pointer 81 and channel indicator board 85.

What is claimed is:

1. A UHF tuner, comprising:

a channel switch-over shaft rotatably mounted in a tuner chassis;

a fine tuning sleeve rotatably supported on said switch-over shaft and provided with an integral gear;

an intermittently rotatable rotary drum fixed to said channel switch-over shaft;

a plurality of cylindrical members slidably supported on said rotary drum;

means for adjusting the axial positioning of said cylindrical members, including a plurality of fine tuning screws rotatably mounted at one end of said cylindrical members and engaging with nuts rotatably supported on said rotary drum;

a sleeve member rotatably and slidably supported in said tuner chassis;

a first pinion gear formed on said sleeve member and maintained in engagement with said integral gear provided on said fine tuning sleeve;

a second pinion gear formed on said sleeve member for engaging with gears formed at the outer peripheral portions of said nuts;

a rotor shaft having a pinion provided thereon;

a slide member slidably supported in said tuner chassis and slidable in the direction of the axis of said channel switch-over shaft and forming a rack engaging with the pinion provided on said rotor shaft;

a torsion spring coupled to said rotor shaft pinion for urging movement of said slide member in one direction; and an engagement piece provided on said slide member for engaging each of said cylindrical members in turn, wherein said slide member is urged by the engaged cylindrical member in a direction against its normal bias to rotate said rotor shaft an amount corresponding to the adjusted axial positioning of the engaged cylindrical member.

2. A UHF tuner according to claim 1, further comprising indicator means for indicating a received channel by converting the linear motion of said slide member to rotational motion, said indicator means comprising a support pin mounted on said tuner and a rotatable arm mounted on said support pin for rotation thereabout, one end portion of said arm being coupled to said slide member.

3. A UHF tuner according to claim 1, wherein each of said fine tuning screws is provided at one end thereof with a conical cam and said slide member is provided with a cam conical roller in the proximity of said engagement piece, said cam provided on each of said fine tuning screws being adapted to engage and be guided by the conical surface of said cam roller before the aforesaid fine tuning screw engages with said engagement piece as said rotary drum assembly rotates in unison with said channel switch-over shaft, said engagement piece being moved with said slide member in accordance with the axial position of said fine tuning screws to cause the corresponding rotation of said rotor shaft for the switching-over of UHF channels.

4. A UHF tuner comprising a tuner proper having a rotor shaft and a torsion spring mounted on a torsion spring shaft, said torsion spring having one end attached to said rotor shaft, the end portion of said torsion spring remote from said rotor shaft being passed through a notch formed in said torsion spring shaft and received in one of a plurality of engagement openings spaced along a circle and formed in a base member provided to said tuner proper, said torsion spring shaft being rotatable to successively switch the tip of said end portion of said torsion spring into engagement in said engagement openings so as to vary the force urging said rotor shaft.

* * * * *